United States Patent [19]

Hedrick et al.

[11] Patent Number: 5,756,021

[45] Date of Patent: May 26, 1998

[54] ELECTRONIC DEVICES COMPRISING DIELECTRIC FOAMED POLYMERS

[75] Inventors: James Lupton Hedrick, Pleasanton, Calif.; Da-Yuan Shih, Poughkeepsie, N.Y.

[73] Assignee: International Business Machines Corporation, Armonk, N.Y.

[21] Appl. No.: 625,789

[22] Filed: Mar. 29, 1996

Related U.S. Application Data

[63] Continuation-in-part of Ser. No. 362,076, Dec. 20, 1994, abandoned.

[51] Int. Cl.$^6$ .................................. C08J 9/28; H01B 7/02
[52] U.S. Cl. ........................................... 264/45.1; 521/64
[58] Field of Search ........................ 264/41, 45.1, 46.4; 174/25 G; 521/64

[56] References Cited

U.S. PATENT DOCUMENTS

| | | |
|---|---|---|
| 2,915,483 | 12/1959 | Barnhart et al. . |
| 3,054,761 | 9/1962 | Moor et al. . |
| 3,213,043 | 10/1965 | Kehr . |
| 3,224,983 | 12/1965 | D'Alelio . |
| 3,332,814 | 7/1967 | Yoshimura et al. ............... 156/54 X |
| 3,547,839 | 12/1970 | Tocker . |
| 3,619,250 | 11/1971 | Nishijima ............................. 521/64 |
| 3,644,168 | 2/1972 | Bonk et al. ........................... 264/41 |
| 3,920,588 | 11/1975 | Träubel et al. ....................... 521/64 |
| 4,159,251 | 6/1979 | Wrasidlo et al. . |
| 4,433,081 | 2/1984 | Britsch ............................ 523/457 X |
| 4,661,526 | 4/1987 | Ford . |
| 4,680,423 | 7/1987 | Bennett et al. ........................ 174/36 |
| 4,732,586 | 3/1988 | Dick et al. . |
| 4,778,950 | 10/1988 | Lee et al. . |
| 4,940,733 | 7/1990 | Kuphal et al. . |
| 4,980,389 | 12/1990 | Hill et al. . |
| 5,021,462 | 6/1991 | Elmes et al. ........................... 521/64 |
| 5,110,998 | 5/1992 | Muschiatti ........................ 174/25 G |
| 5,116,883 | 5/1992 | LeMay . |
| 5,178,988 | 1/1993 | Leech et al. .................... 430/280 X |
| 5,306,869 | 4/1994 | Springer et al. ....................... 74/36 |
| 5,333,229 | 7/1994 | Sayegh ............................... 385/102 |
| 5,422,377 | 6/1995 | Aubert . |
| 5,444,097 | 8/1995 | Tkacik . |

FOREIGN PATENT DOCUMENTS

0593966A1  10/1993  European Pat. Off. .

OTHER PUBLICATIONS

J. H. Aubert and C. L. Jackson and M. T. Shaw, The Linear Elastic Properties of Microcellular Foams, Polymer, vol. 32, No.2, 1991, pp. 221–225.

W. R. Even Jr. and D. P. Gregory, Emulsion–Derived Foams: Preparation, Properties, and Application, MRS Bulletin, A Pub. of the Mat. Res. Society, vol. XIX, No. 4, ISSN: 0883–7694, Apr. 1994.

J. L. Hedrick, M. Jurek, Chemical Modification of Matrix Resin Networks with Engineering Thermoplastics . . . , Polymer, vol. 32, No. 11, pp. 2020–2032, 1991.

Patel, Yoo, Kilic & McGrath, Microporosity in Thin Polymer Films, paper.

Patel, Moy, McGrath, & Prime, The Cure of Epoxy and Poly(Propylene Oxide) Modified Epoxy Systems via Dynamic Mechanical Analysis, paper.

*Primary Examiner*—David A. Simmons
*Assistant Examiner*—Kenneth M. Jones
*Attorney, Agent, or Firm*—Robert B. Martin

[57] ABSTRACT

The present invention relates to an electronic device for distributing electrical signals between electronic elements comprising a dielectric foamed thermoset polymer having a plurality of electrical circuits.

7 Claims, 2 Drawing Sheets

ELECTRONIC DEVICES COMPRISING DIELECTRIC FOAMED POLYMERS

This is a continuation-in-part of application Ser. No. 08/362,076 filed on Dec. 20, 1994 now abandoned.

TECHNICAL FIELD

The present invention relates to electronic devices comprising dielectric foamed polymers and the process for manufacturing the devices.

BACKGROUND OF THE INVENTION

There is a continuing desire in the electronics industry to increase the circuit density in electronic components, e.g., circuit boards, multichip module chip test devices, and the like without degrading electrical performance (e.g., crosstalk) and also to increase the speed of signal propagation in these components. One method of accomplishing these goals is to reduce the dielectric constant of the polymeric insulator used in the components. A method for reducing the dielectric constant of a polymeric insulator is to foam the polymer with air-filled pores.

A prior art process of making polymeric foams involves dispersing thermally decomposable particles in the monomer reaction mixture. The mixture is then heated to cause polymerization and thermal decomposition of the particles to form a gas. The gas expansion forms pores in the polymer resin. Unfortunately, the process results in nonuniform distribution of pores throughout the bulk and also in nonuniform pore sizes. This results in unacceptable variations of the dielectric constant throughout the bulk of the polymeric resin.

It is therefore an object of the present invention to provide an improved foamed dielectric polymer for use in electronic components.

Other objects and advantages will become apparent from the following disclosure.

SUMMARY OF THE INVENTION

The present invention relates to an electronic device for carrying electrical current to electronic components comprising a dielectric foamed thermoset polymer having an electrical circuit. The polymer is foamed by the steps of: (a) polymerizing a solution of a crosslinkable precursor (monomer or oligomer) in a solvent, (b) crosslinking (gelling) the polymer during phase separation of the solvent, and (c) removing the solvent to form the foamed crosslinked polymer. A preferred polymer is a polycyanurate. Preferred electronic devices include an integrated circuit chip test probe and pinless connector for packaging.

A more thorough disclosure of the present invention is presented in the detailed description and the drawings.

DETAILED DESCRIPTION OF THE INVENTION

The present invention relates to an electronic device for distributing electrical signals between electronic elements comprising a dielectric foamed thermoset polymer having a plurality of electrical circuits. The foamed polymer has small air bubbles uniformly distributed throughout the continuous polymer bulk.

Figure 1:
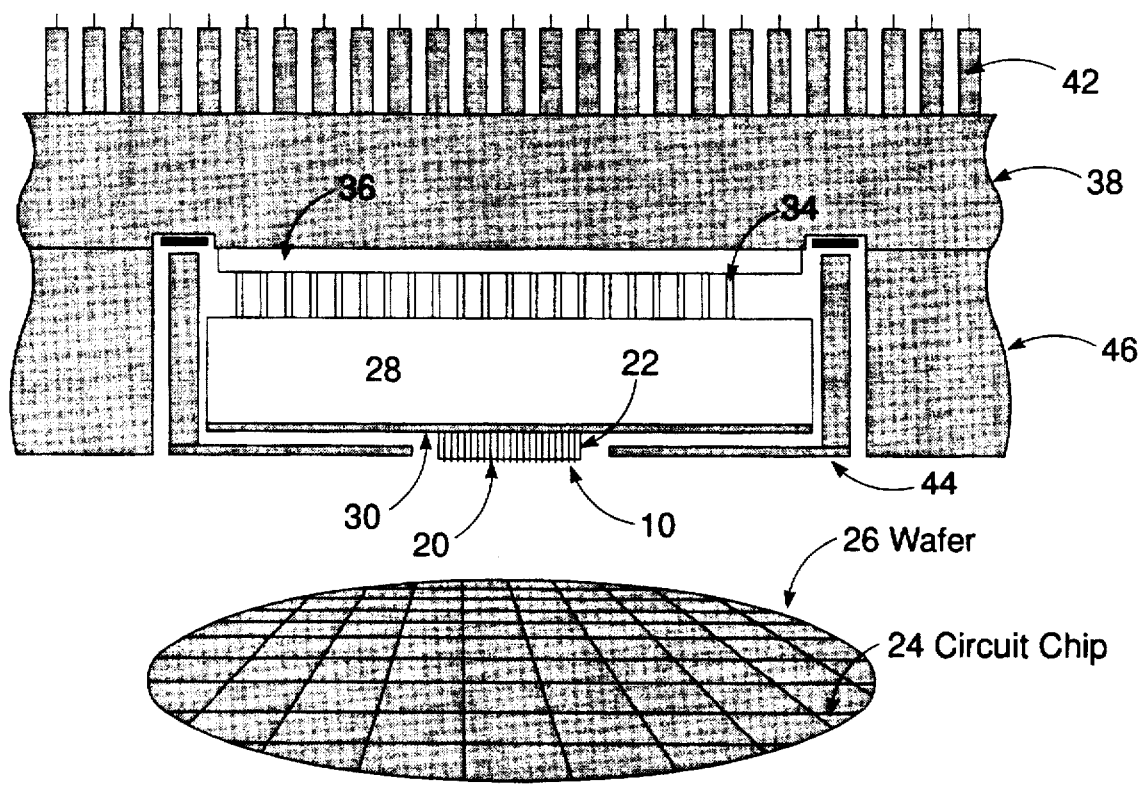
FIG. 1 is a schematic diagram of a probe test structure embodiment of the electronic device of the present invention.

Referring to FIG. 1, there is shown one embodiment, a test probe, of an electronic device of the present invention. The test probe generally comprises probe head 10 having a plurality of elongated electrically conducting wires 20 embedded in a dielectric foamed thermoset polymer 22. The wires 20 have free ends for probing contact locations on a circuit, such as C4 solder balls or aluminum pads, on integrated circuit chips 24 of wafer 26. However, the probe can be used to test other electronic devices. The opposite ends of elongated electrical wires 20 are in electrical contact with space transformer (or fan-out substrate) 28. In the preferred embodiment, space transformer 28 is a multilevel metal/ceramic substrate, a multilevel metal/polymer substrate, or a printed circuit board which is typically used as a packaging substrate for integrated circuit chips. Space transformer 28 has, in the preferred embodiment, a surface layer 30 comprising a plurality of thin dielectric films, preferably polymer films such as polyimide, and a plurality of layers of electrical conductors, for example, copper conductors. A process for fabricating a multilayer structure to form a space transformer 28 is described in U.S. patent application Ser. No. 07/695,368, filed on May 3, 1991, entitled "Multi-layer Thin Film Structure and Parallel Processing Method for Fabricating Same", which is assigned to the assignee of the present invention, the teaching of which is incorporated herein by reference. Space transformer 28 has a plurality of pins 34. Pins 34 are standard pins used on integrated circuit chip packaging substrates. Pins 34 are inserted into socket 36 or plated through-holes in the substrate of a second space transformer 38. Socket 36 is a type of pin grid array (PGA) socket such as is commonly disposed on a printed circuit board of an electronic computer for receiving pins from a packaging substrate. Second space transformer 38 can be any second level integrated circuit packaging substrate, for example, a standard printed circuit board. On the opposite surface of transformer 38 there are disposed a plurality of electrical connectors to which coaxial cables 42 are electrically connected. Alternatively, socket 36 can be a zero insertion force (ZIF) connector or the socket 36 can be replaced by through-holes in the transformer 38 wherein the through-holes have electrically conductive material surrounding the sidewalls, such as a plated through-hole.

Space transformer 28 is held in place with respect to space transformer 38 by L-shaped clamp 44. The entire assembly of the first and second space transformers are held in place with respect to wafer 26 by assembly holder 46, which is part of an integrated circuit testing tool.

Figure 2:
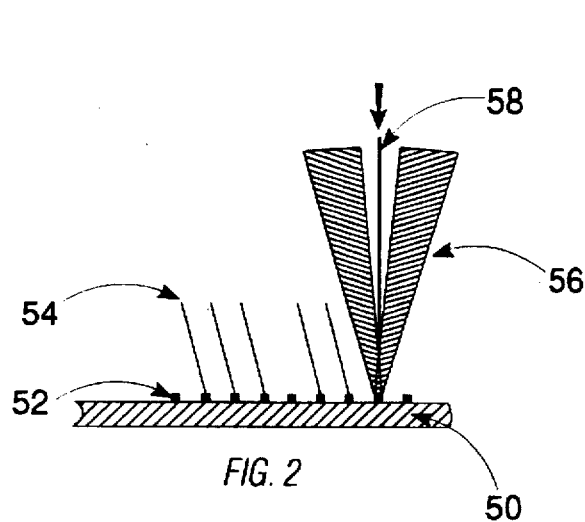
FIGS. 2-4 show the process for making the probe test structure.
Figure 3:
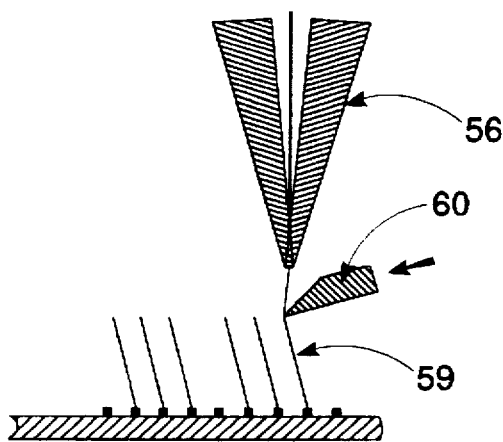
Figure 4:
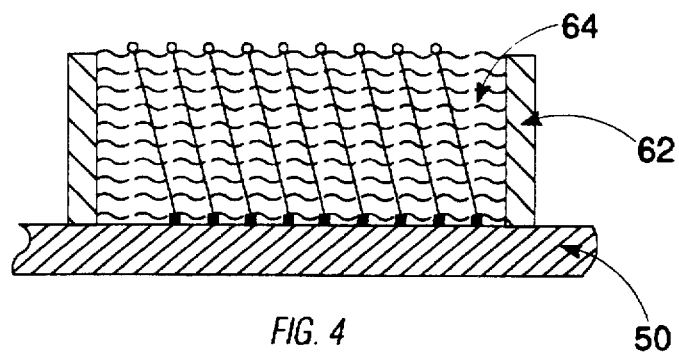

Referring to FIGS. 2-4, there is shown a convenient fabrication process for the test probe head embodiment of the present invention. The substrate 50 of a space transformer having contact pads 52 thereon is placed in a wire bonding tool. The top surface of pad 52 is coated by a method such as evaporation, sputtering, or plating with soft gold or nickel/gold (Ni/Au) to provide a suitable surface for thermosonic ball bonding. Other bonding techniques can be used such as thermal compression bonding, ultrasonic bonding, laser bonding, and the like. A commonly-used automatic wire bonder 56 is modified to ball bond gold, gold alloy, copper, copper alloy, aluminum, platinum, nickel, or palladium wires 54 to the pad 52. The wire preferably has a diameter of less than 0.005 inches. If a metal other than Au is used, a thin passivation metal such as Au, Cr, Co, Ni, or Pd can be coated over the wire by means of electroplating, or electroless plating, sputtering, e-beam evaporation, or any other coating techniques known in the industry. The bonder 56 has a wire 58 being fed from a reservoir of wire as in a conventional wire bonding apparatus. FIG. 2 shows the bonder 56 in contact with the surface of a pad 52. An electrical discharge from an electrode at the base of bonder 56 is used to melt the end of the wire onto pad 52.

FIG. 3 shows the bonder 56 withdrawn from the surface of substrate 50 and the wire 58 drawn out to leave wire 59 connected to a pad 52. The wire 59 is positioned at an angle, preferably between 5–60 degrees from vertical, and then mechanically notched (or nicked) by knife edge 60. The knife edge 60 is actuated, the wire 58 is clamped, and the bonder 56 is raised. The wire is pulled up and breaks at the notch or nick.

Optionally, a ball can be formed on the end of the wire using a laser or electrical discharge to melt the end of the wire. Techniques for this are commonly known in the art. A split-beam laser delivery system is used to localize the laser energy to a single wire for forming the ball. This minimizes the laser energy absorbed by adjacent wires that could cause the wires to deform.

Referring to FIG. 4, after the wire bonding process is completed, a casting mold 62 is placed on the surface of the substrate 50. A controlled volume of a low-viscosity solution 64 of one or more crosslinkable precursors in a solvent is disposed into the casting mold and allowed to settle out (flow between the fine wires without disrupting the wires until the surface is level).

The liquid solution 64 comprises crosslinkable precursor(s) (monomer or oligomer) dissolved in a solvent. Suitable crosslinkable precursors include monomers and oligomers. Suitable thermoset polymers for the probe head include epoxy, unsaturated polyesters, polyimides (from bismaleimides or bisnadimides), polycyanurates, and thermoset polymers from (phenol/formaldehyde), (urea/formaldehyde), or (melamine/formaldehyde). Other suitable thermoset polymers will be known to those skilled in the art. The appropriate crosslinkable precursor(s) (monomer or oligomer) of the desired thermoset polymer are dissolved in a nonpolymeric solvent, preferably an organic solvent. Suitable solvents have solubility parameters (for both polarity interactions and hydrogen bonding) which are close to the solubility parameters of the crosslinkable precursor(s). These solubility parameters can be readily calculated by those skilled in the art as disclosed by Van Krevelen et al., "Properties of Polymers, Their Estimation and Correlation with Chemical Structure", Elsevier Scientific Publishing Co., 1976, the disclosure of which is incorporated herein by reference. Preferably, the solubility parameters of the solvent will not be close to the solubility parameters of the thermoset polymer product to minimize solvent uptake by the product. Suitable solvents for epoxy polymer products include hexane, cyclohexane, and carbon dioxide. Suitable solvents for polycyanurate products include cyclohexanes. Other suitable solvents for the process of the present invention will be known to those skilled in the art. The solvent will comprise less than 30 weight % of the prepolymer solution (crosslinkable precursors and crosslinking agent in solvent); preferably less than 25 weight % and more preferably less than 20 weight %.

The solution also may comprise a crosslinking agent to crosslink the polymer product such as for epoxy-protonic or Lewis acids, alkaline earth compounds or transition metal compounds. Other suitable crosslinking agents will be known to those skilled in the art. The solution may also comprise other components such as a catalyst to enhance crosslinking such as triethylamine, organic acids, and anhydrides.

Generally, the reaction solution is then heated to cause polymerizing of the monomer/oligomer. Because the reaction mixture is a low-viscosity, stable solution, the reaction solution can be injection or compression molded or cast before or during the polymerizing step of the reaction to form the electronic device of the present invention. If carbon dioxide or other low-boiling solvents are utilized, the reaction mixture must be maintained under pressure during the polymerization and gelling step of the process such as in a glass container. As the molecular weight of the polymer increases, the solvent becomes less soluble in the polymerization medium. At the cloud point, the solvent will begin to phase separate from the polymerized product. Phase separation as used herein shall mean physical change of a solution of two miscible liquids to two immiscible liquids which have coalesced into two continuous separate phases. During the phase-separation process, the two immiscible liquids will generally form a suspension prior to coalescing.

In the process, a gelation occurs during the phase separation. Gelling as used herein means crosslinking the polymer to change the reaction medium from a liquid to a gel which is elastic, does not flow, and does not permit bubbles of gas to rise in its bulk. Gelation of the polymer during phase separation captures tiny bubbles of solvent in the polymer bulk. These bubbles or solvent reservoirs are uniformly distributed throughout the bulk of the polymer and, after gelation, are permanently fixed in that location in the bulk of the polymer. The onset of gelation can be predicted by those skilled in the art. In one embodiment, vitrification of the polymer occurs prior to phase separation to limit the bubble size during phase separation to about 0.1 micron to form a clear bulk polymer.

After completion of the crosslinking of the polymer and phase separation of the solvent, the solvent is removed from the polymer to form the foamed polymer. The solvent can be removed by heating the polymer to an elevated temperature of about 100°–250° C. for a period of about 1–2 hours. Alternatively, the solvent can be removed by immersing the polymer in a nonsolvent. Suitable nonsolvents include methanol, water, acetone, and alkanes such as pentane or hexane. When carbon dioxide is used as the reaction solvent, it can be removed by simply exposing the polymer to the atmospheric conditions. Other methods of removing the solvent bubbles from the reaction product to form the foamed thermoset polymer will be known to those skilled in the art.

The foamed thermoset polymer of the present invention has uniformly distributed closed cell pores throughout the bulk of the polymer to provide a uniform dielectric constant. Further, the pore size can be adjusted (from submicron (about 0.1 micron) to about 30 microns) by varying solvent polarity and curing conditions. The polymer has low stress, high thermal stability, and improved toughness.

Figure 5:
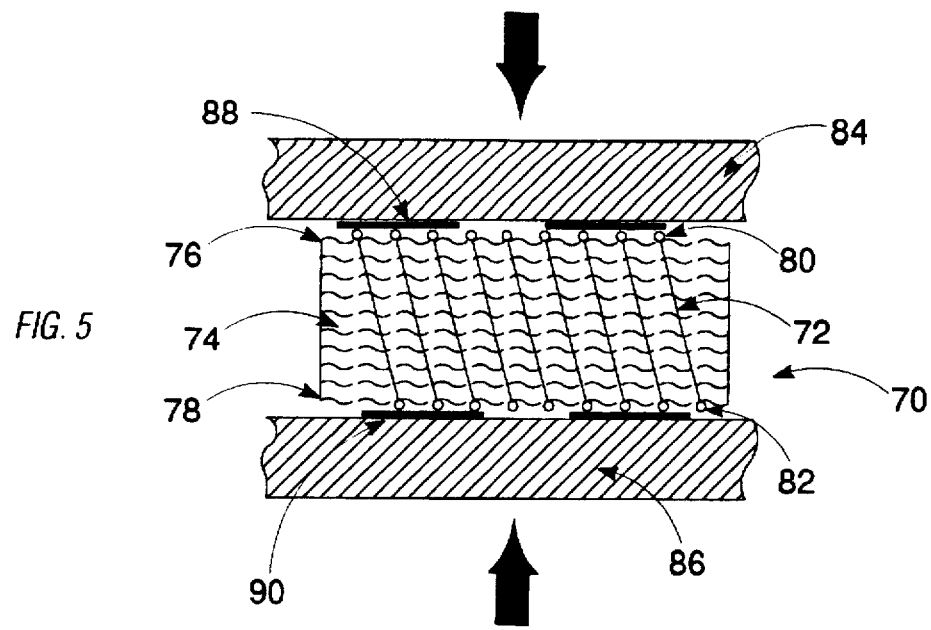
FIG. 5 is a cross-sectional view of the pinless connector embodiment of the electronic device of the present invention.

Referring to FIG. 5, there is shown a pinless connector which is an alternative embodiment of the electronic device of the present invention.

The connector 70 generally comprises a plurality of fine electrical conductors (wires) 72 disposed in a foamed dielectric thermoset polymeric composition 74 and extend from side 76 of the connector to side 78 of the connector. Each conductor 72 preferably has a generally spherical end 80 at side 76 and a flattened spherical shape 82 at side 78. The conductors 72 are preferably gold, gold alloy, or copper alloy, and the size, shape, and spacing of wires 72 can be modified to optimize the connector for a specific application.

The connector is disposed between mated electronic components 84 and 86, such as an integrated circuit chip and a multichip module. The components 84 and 86 are provided with electrical contact pads 88 and 90. The components 84 and 86 are pressed toward each other as indicated by arrows with the connector there between. The foamed thermoset composition 74 acts as a spring to push the end contact surfaces 80 and 82 against mating contacts 88 and 90 on components 84 and 86, respectively, thereby maintaining good electrical contact.

The connector can be fabricated in a variety of art-known methods. Suitably, the process disclosed above is utilized except that wires are connected to a sacrificial substrate rather than the substrate of a space transformer. The sacrificial substrate is preferably copper, cooper/Invar/copper, or copper/molybdenum copper. Materials other than copper can be used such as aluminum, hard plastic, or steel. After the foamed polymer has been completely cured, the substrate can be removed by placement in a sulfuric acid bath to dissolve the substrate. Ultrasonic agitation of the sulfuric acid helps to facilitate the etching of the copper substrate and causes the gold plating on the surface of the copper substrate to flake off from the surface of the structure, leaving the surfaces of the ball ends exposed.

Other types of electronic devices of the present invention include packaging devices. These devices are well known to those skilled in the art and can be fabricated by the process disclosed herein.

The following example is a detailed description of the method of preparation and use of certain compositions of the present invention. The detailed preparation falls within the scope of, and serves to exemplify, the more generally described methods of preparation set forth above. The examples are presented for illustrative purposes only, and are not intended as a restriction on the scope of the invention.

EXAMPLE 1

0.95 gms of an epoxy resin with an equivalent molecular weight of 342 g/mole, 1.49 gms of diamine curing agent (DACM-20 sold by Air Products, Inc.), and 3 gms of cyclohexane were placed in a vial and stirred until homogeneous (~10 min). The mixture was then placed in a Fisher-Porter reactor and heated to 160° C. The mixture remained homogeneous until the onset of crosslinking network formation, where the cyclohexane, becomes a nonsolvent and phase separates. After cooling, the crosslinked polymer was placed in a vacuum oven and heated to a temperature of 180° C. for 8 hours to remove the phase-separated nonsolvent, leaving pores the size of 5–10 microns.

EXAMPLE 2

6.5 gms of cyanurate resin (L-10 from CibaGigy) was slurried with 3.0 gms of cyclohexane. Upon heating, the mixture became homogeneous. The mixture was placed in a mold and heated to 200° C. under pressure to crosslink the polymer. The solvent was then removed to form the foamed crosslinked polymer having pore sizes of 5–20 microns.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. A process for making an electrical device having a first and second surface and comprising a foamed crosslinked, closed cell polymer and a plurality of electrically conducting wires extending through the polymer from the first to the second surfaces of the electrical device, the process comprising the steps of:

(a) disposing a solution of crosslinkable precursor in a solvent around a plurality of electrically conducting wires;

(b) polymerizing the precursor to form a crosslinked polymer wherein the polymer is crosslinked polycyanurate;

(c) gelling the crosslinked polymer with phase separation of the polymer from the solvent; and (d) removing the solvent from the gelled polymer to form the electrical device.

2. The process of claim 1 wherein the wires have a diameter less than 0.005 inches.

3. The process of claim 1 wherein the solvent is hexane, cyclohexane, or carbon dioxide.

4. The process of claim 1 wherein the solvent is removed by heating the polymer.

5. The process of claim 1 wherein the solvent is removed by washing the polymer with a nonsolvent.

6. The process of claim 1 wherein the solvent is removed by exposure of the polymer to the atmosphere.

7. The process of claim 2 wherein the foamed polymer has a pore size of about 0.1 to about 10 microns.

* * * * *

UNITED STATES PATENT AND TRADEMARK OFFICE
CERTIFICATE OF CORRRECTION

PATENT NO. : 5,756,021
DATED : May 26, 1998
INVENTOR(S) : James Lupton Hedrick, et al.

It is certified that error appears in the above-identified patent and that said Letters Patent is hereby corrected as shown below:

On the title page, item [56], insert the following:

U. S. PATENT DOCUMENTS

| EXAMINER INITIAL | | PATENT NUMBER | | | | | | | ISSUE DATE | PATENTEE | CLASS | SUBCLASS | FILING DATE IF APPROPRIATE |
|---|---|---|---|---|---|---|---|---|---|---|---|---|---|
| | | 5 | 5 | 7 | 3 | 9 | 9 | 4 | 11/12/96 | Kabra et al. | | | |
| | | | | | | | | | | | | | |

Signed and Sealed this

Twentieth Day of April, 1999

Attest:

Q. TODD DICKINSON

*Attesting Officer*   Acting Commissioner of Patents and Trademarks